(12) United States Patent
Reinhold et al.

(10) Patent No.: US 8,049,654 B2
(45) Date of Patent: Nov. 1, 2011

(54) DIGITAL TRIMMING OF SAR ADCS

(75) Inventors: Michael Reinhold, Erlangen (DE);
Frank Ohnhaeuser, Stein (DE); Mikael Badenius, Adelsdorf (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/711,060

(22) Filed: Feb. 23, 2010

(65) Prior Publication Data

US 2010/0214140 A1 Aug. 26, 2010

(30) Foreign Application Priority Data

Feb. 23, 2009 (DE) .................. 10 2009 010 155

(51) Int. Cl.
*H03M 1/12* (2006.01)
(52) U.S. Cl. ....................... 341/172; 341/144
(58) Field of Classification Search .................. 341/172, 341/155, 150, 144, 161, 121
See application file for complete search history.

(56) References Cited

U.S. PATENT DOCUMENTS

| | | | | |
|---|---|---|---|---|
| 4,947,169 A * | 8/1990 | Smith et al. | .................... | 341/121 |
| 5,446,420 A * | 8/1995 | Westwick | ...................... | 331/179 |
| 5,581,252 A * | 12/1996 | Thomas | ........................ | 341/144 |
| 6,124,818 A * | 9/2000 | Thomas et al. | ................. | 341/155 |
| 6,400,302 B1 * | 6/2002 | Amazeen et al. | .............. | 341/172 |
| 7,218,259 B2 | 5/2007 | Hurrell et al. | | |
| 7,439,896 B2 * | 10/2008 | Sutardja | ....................... | 341/150 |
| 7,453,389 B1 * | 11/2008 | Vu et al. | ......................... | 341/172 |
| 2005/0200510 A1* | 9/2005 | Yoshida et al. | ............... | 341/155 |
| 2007/0035434 A1* | 2/2007 | Tachibana et al. | ............ | 341/161 |
| 2008/0186214 A1 | 8/2008 | Janakiraman | | |

* cited by examiner

*Primary Examiner* — Jean Jeanglaude
(74) *Attorney, Agent, or Firm* — John J. Patti; Wade J. Brady, III; Frederick J. Telecky, Jr.

(57) ABSTRACT

Successive approximation register (SAR) analog-to-digital converters (ADCs) generally employ capacitive digital-to-analog converters (CDACs) to perform data conversions. In these CDACs, matching of capacitive values is important, and for conventional high resolution SAR ADCs, complex trimming or calibration procedures can be too costly. Here, however, a SAR ADC is provided that performs error correction so as to reduce the overall cost compared to conventional SAR ADCs.

13 Claims, 5 Drawing Sheets

DIGITAL TRIMMING OF SAR ADCS

CROSS-REFERENCE TO RELATED APPLICATIONS

This application is claims priority from German Patent Application No. 10 2009 010 155.1, filed Feb. 23, 2009, which is hereby incorporated by reference for all purposes.

FIELD OF INVENTION

The invention relates generally to an analog-to-digital converter (ADC) using successive approximation.

BACKGROUND

A typical successive approximation register (SAR) ADC includes capacitive digital-to-analog converter (CDAC) for performing a successive approximation of a sampled input signal. The CDAC includes an array of capacitors, where each capacitor can be assigned to a bit of the digital output word of the SAR ADC. Generally, the capacitors can be commonly coupled at a common node, which can be coupled to an input of a comparator. During each conversion step, the comparator 110 are its input signals and provides a bit of a digital output word to a control stage or SAR controller. Each of the capacitors of the CDAC are then switched in accordance with the comparison result.

Additionally, the capacitors of the CDAC may be further subdivided in to two or more stages. For example, there may be a first stage or main CDAC that includes capacitors relating to the most significant bits (MSBs) of the digital output word of the SAR ADC and a second stage or sub-CDAC that includes capacitors related to the least significant bits (LSBs) of the digital output word of the SAR ADC. There may also be a serial capacitor coupling the main CDAC and the sub-CDAC for scaling the two stages for approximation steps relating to the MSBs and the LSBs, respectively. The absolute capacitance values in the two stages may also be almost similar. However, in order to achieve high resolution, and good linearity, the matching of the capacitance values is important.

With the typical matching constraints of capacitance values in a semiconductor (e.g., CMOS) technology, a resolution of the SAR ADC of about 10 to 12 bit can be achieved. For higher resolution the capacitors mismatch has to be adjusted. The digital output word of the SAR ADC can be digitally corrected by adding or subtracting digital correction values in order to compensate static mismatch of the capacitance values. However, this approach is only applicable as long as the successive approximation process converges. Convergence generally means that at the end of the conversion procedure, a voltage difference at the comparator input is equal to or smaller than the value that corresponds to an LSB. If mismatch becomes too large, digital correction becomes impossible. Therefore, the capacitance values in the main CDAC have to be physically trimmed after production in order to achieve improved matching and to guarantee convergence of the successive approximation process. Ideal convergence generally means that the voltage difference between the comparator inputs corresponds to a value that is smaller than $+/-\frac{1}{2}$ LSB. The capacitors in the sub-CDAC (relating to the LSBs) are usually not trimmed after production of the integrated circuit.

There are several different principals which can be applied for trimming the capacitors of the main-CDAC. One is based on laser trimming, where capacitor values are added or subtracted from the capacitor array by use of laser beam, which removes connections in a prior assembly step. Another principle is based on adding or subtracting capacitors to and from the capacitor array based on setting switches and storing the appropriate states of the switches in a memory. Both techniques may use a self calibration procedure which aims to determine the amount of mismatch of the capacitors indicating the capacitance values which are to be added or subtracted from the capacitors of the main CDAC. However, both trimming and calibration procedures require a rather complex production step, which increases production costs. Furthermore, the trimming process for correcting the capacitance values of the main CDAC based on switches and capacitors and a memory requires a large amount of additional chip area for the switches and the memory.

U.S. Pat. No. 6,747,589 generally discloses a dynamic error correction step for an SAR ADC in order to increase speed and reduce current drive requirements of the SAR ADCs. The basic idea consists in testing a bit decision as to whether or not the error is below a maximum admissible limit. Testing and correction is performed quasi-simultaneously by selectively coupling one or two additional correction capacitors of the same size as the capacitor of the tested bit. The two additional correction capacitors are switched between the reference voltages in order to add or subtract a charge value to the network, which is equivalent to a certain bit capacitor and the output of the comparator is used as an indicator of the error. The correction capacitors provide that the successive approximation process converges. However, the digital output word of the SAR ADC is corrected by adding or subtracting single bits corresponding to the corrected position and the mismatch of the capacitance values of the capacitors is removed by trimming procedures as described above.

There are more and less significant bits in a digital output word of a SAR ADC, and corresponding more or less significant capacitors in the CDAC. The significance of a capacitor is not strictly related to its capacitance value, but rather to its contribution to the voltage level on the comparator input (common node). This contribution can be considered as a difference voltage or voltage step $\Delta V$ on a node, typically on the common node. The more significant bits of a digital output word are determined earlier than less significant bits during the successive approximation process. Therefore, the capacitor(s) are also used in order of their significance starting with the most significant capacitor and ending with the least significant capacitor(s).

In an integrated circuit or IC, the maximum and the minimum physical size of a capacitor is limited. The upper limit is due to chip costs due to chip area and the lower limit due to technological boundaries, as minimum structure size and parasitic effects. Therefore, the minimum and maximum capacitance value of a capacitor should remain within reasonable limits.

SUMMARY

Accordingly, an ADC using successive approximation is provided. The ADC comprises a CDAC including a plurality of capacitors. The plurality of capacitors is coupled with a first side to a common node. There is also a comparator with an input coupled to the common node. The comparator is adapted to make bit decisions by comparing a voltage level at the common node with a voltage level on another comparator input. There is a control stage that is configured to control the voltage level on the common node during a plurality of successive approximation steps. The control stage consecutively switches a second side of the capacitors of the plurality of capacitors to a first reference voltage or a second reference voltage in response to the bit decisions of the comparator. In some embodiments, ground or supply voltage levels may also serve as reference voltage levels. The IC is further adapted to perform at least one error correction step after an approximation step so as to limit (or reduce) a maximum error voltage on the common node. This error voltage is at least partially due to static mismatch of capacitors used during preceding approximation steps. The error voltage is equal to or lower than a maximum voltage change on the common node that can be achieved during subsequent steps. The subsequent steps may include normal approximation steps and further error correction steps.

The position of the error correction step depends on many parameters as for example the architecture, capacitor sizes, capacitance values and ratios, the used semiconductor technology etc. However, an appropriate position for the error correction, i.e., the appropriate approximation step after which an error correction step has to be performed can be determined according to the following considerations.

For example, an ADC may have N bits resolution. It may comprise $2^{N-1}$ capacitors in a single CDAC. The capacitor corresponding to the smallest voltage step on the common node is the one used for determining the LSB. The capacitor for the MSB may then have 2 to the power of N−1 times the capacitance value of the capacitor used for the LSB (binary weighted). The maximum mismatch of two LSB capacitors may be m %. The mismatch value is given by the used technology. For Gaussian distribution the mismatch of the MSB capacitor may be m % times square root of $2^{N-1}$.

However, considering that all smaller capacitors (MSB−1 to LSB) of the CDAC have to match with the MSB capacitor, it follows that m % times the square root of $2^{N-1}$ is the maximum mismatch. As the sign of the mismatch may be different, the maximum mismatch may be approximately two times m % times the square root of $2^{N-1}$. This is a percentage that may be determined dependent on the technology, the number of capacitors and the resolution of the ADC. If the capacitance value of the MSB capacitor is $2^{N-1}$ times the LSB capacitor, the capacitance value of the correction capacitor CCORR is:

$$CCORR = m \ \% \ \left(\sqrt{2^{N-1}} + \sqrt{2^{N-1}-1}\right) 2^{N-1} C_0 \qquad (1)$$
$$\approx 2m \ \% \ \sqrt{2^{N-1}} \, 2^{N-1} C_0$$

where $C_0$ may be the capacitance value of a unity-capacitor. $C_0$ may also be the capacitance value of the LSB capacitor. The position at which the dynamic error correction step may be performed is then, for example, between two capacitors $C_x$ and $C_{x-1}$ of the CDAC with $$C_x \geq CCORR \geq C_{x-1} \qquad (2)$$

However, the correction step may be split in multiple smaller correction steps. The over all voltage change ΔV at the common node that must be achieved with the error correction is:

$$\Delta V \approx CCORR \qquad (3)$$

In an embodiment, N may be 10. The CDAC may then have 10 capacitors $C_0$ to $C_9$ in a single capacitor array. The capacitors are coupled with one side at a common node. For a given resolution and error distribution a maximum deviation can be predicted (for example Gaussian distribution and 6σ). The LSB capacitor $C_0$ may have the size of one unity-capacitor and $C_9$ may have the size of 512 unity capacitor. The maximum acceptable statistical mismatch % m between two unity capacitors $C_0$ may be three times the standard deviation, i.e. 3σ. This value is given and may amount to m %=0.1%.

For Gaussian distribution of the errors, the mismatch of $C_9$ is maximum and amounts to $\sqrt{512}m\%=2.26\%$. In the worst case scenario, the remainder of the capacitor array CDAC has to match with $C_9$. This means that only $2^{N-1}$ unity-capacitors have to be considered. Furthermore, the sign of the static mismatch doubles the mismatch. With the above equation the capacitance value of the correction capacitor can be determined:

$$CCORR = 2m \ \% \ \sqrt{2^{N-1}} \, 2^{N-1} C_0 \qquad (4)$$
$$= 20.1\% \ \sqrt{512} \, 512 C_0$$
$$= 23.1 C_0$$

For the binary weighted capacitors of the CDAC, the error correction step may be placed between $C_5=32 \, C_0$ and $C_4=16 \, C_0$.

Each capacitor of the plurality of capacitors may have a significance corresponding to a bit of the digital output word, i.e. the respective capacitor is used during the successive approximation procedure for determining the respective bit. An error correction step (e.g., a dynamic error correction step) may be applied after a specific bit decision in order to ensure convergence of the whole successive approximation procedure of the analog-to-digital conversion. If the mismatch between the capacitance values of the capacitors of the CDAC is too large, it is possible that after the first approximation steps including the more significant capacitors of the CDAC, an error voltage occurs which is too large to be compensated by the subsequent approximation steps. Therefore, a dynamic error correction step is inserted, in order to ensure or re-establish convergence. Convergence means that at the end of the conversion the absolute difference voltage across the inputs of the comparator corresponds to less than half a LSB.

One or more error correction capacitors (relating to one or more error correction steps) may be provided, which are coupled with one side to the common node and adapted to be coupled with the other side to either the first or the second reference voltage for performing the error correction step(s). This is an efficient way of compensating or reducing the error voltage due to mismatch. After switching the error correction capacitors, the voltage on the common node is checked with the comparator for plausibility. If the error voltage has left the maximum admissible range, the error correction capacitor is switched so as to reduce the error voltage to a level, which allows the subsequent approximation steps to converge. In an embodiment, the IC may include a first error correction capacitor and a second error correction capacitor, which are both coupled with one side to the common node. The error correction capacitors can be used during the error correction step for adjusting the first voltage. In an advantageous aspect of the invention, the capacitance values of the first error correction capacitor and the second error correction capacitor can be chosen such that they are equal to the capacitance value of the capacitor used during the last approximation step. The error correction capacitance values may also be greater than half the capacitance value of the first capacitor and at least 3σ smaller than the first capacitor with respect to the maximum expected matching error. In another embodiment, it may be smaller than the capacitance value of the first capacitor. In still another advantageous embodiment, the error correction capacitance values may be at least 3σ plus one LSB (upper limit) smaller than the first capacitor with respect to the maximum expected matching error. For practical reasons, the capacitance value may then be rounded to the next reasonable value below the previously mentioned limit.

Advantageously, the capacitance values of the correction capacitors can be dimensioned with respect to the maximum mismatch that is to be expected for the technology being used. This aspect of the invention can provide that the dynamic error correction step does not introduce an additional error which may prevent convergence.

The IC may further comprise at least one fine tuning capacitor with a significance that is less than the least significant bit. The fine tuning capacitor may be coupled with a first side to the common node. The significance of the capacitor does not strictly relate to its capacitance value, but rather to its voltage or charge contribution to the common node when the fine tuning capacitor is switched between reference voltages. This contribution is smaller then the contribution of the capacitor used to determine the least significant bit. However, in an embodiment, the capacitance value of the fine tuning capacitor can be smaller than the capacitance value of the capacitor of the CDAC associated with the least significant bit. The at least one fine tuning capacitor may advantageously be used for analog trimming of the CDAC. According to this aspect of the invention, it is possible to achieve a resolution that is even higher than the resolution that can be achieved with a trimmed or calibrated capacitor array of the same size. There may be one fine tuning capacitor having half the voltage or charge contribution (or capacitance value) of the lowest significant capacitor, or there can be several fine tuning capacitors having half, a quarter and one eighth of the significance of the lowest significant capacitor.

The IC may further include an arithmetic stage, which is adapted to determine digital error correction values of the static mismatch. The arithmetic stage can then be configured to adjust an intermediate or final digital conversion result with the digital correaction values. In an embodiment, the IC may include an adder stage for adding digital error correction values to the digital output word. The arithmetic stage can be adapted such that the digital error correction values compensate a static mismatch of the capacitance values of the capacitors having a higher significance than the first capacitor. If convergence of the successive approximation process is established through the error correction step, the static mismatch error can be corrected by digital correction only without the need for trimming. The arithmetic stage according to this aspect of the invention and the control stage can be adapted to perform not only a single operation with respect to the dynamic error correction step, but all necessary calculation steps for digitally or numerically compensating the static mismatch. Therefore, fine tuning capacitors and switches or post production laser trimming for the more significant capacitors can be avoided.

The digital error correction values may be extended so as to include a bit position for the at least one fine tuning capacitor. The arithmetic stage can be adapted to perform mathematical operations on the extended digital error correction values so as to provide an extended intermediate or final conversion result. In this aspect of the invention, the digital correction values may be extended to include values representing only fractions of an LSB of the digital output word. The arithmetic stage may then be adapted to operate on the extended digital correction words. During analog-to-digital conversion, the digital correction words may be added to an intermediate digital output word which is established stepwise by the successive approximation procedure. After the conversion steps relating to the most significant capacitor and the less significant capacitors until the conversion step associated with the first capacitor to which the dynamic error correction step is applied, the respective digital error correction words can be added in order to compensate the static mismatch. After the dynamic error correction step, the LSB or the LSBs of the digital error correction values, which correspond to the one or more fine tuning capacitors are evaluated and the one or more fine tuning capacitors are switched to either the first reference voltage or the second reference voltage in accordance with the values of the LSB or the LSBs. The setting of the fine tuning capacitors may be finished before the conversion step following the conversion step after which the error correction is performed. These aspects of the invention provide that a higher accuracy of the digital output word can be achieved. However, the bit length of the digital output word remains unchanged (i.e., is not extended).

The arithmetic stage may further be adapted to switch the at least one fine tuning capacitor with a second side to the first or the second reference voltage based on a value of a least significant bit of the extended intermediate output word. This means that correaction is performed partially analog.

The voltage error due to static mismatch of those capacitors, which have already been used in the CDAC is determined and compensated for by adding digital values to the intermediate digital output word. The minimum condition for the significance of the first capacitor to which the dynamic error correction step is applied is that the trimming range relating to the first capacitor, which can be covered by the dynamic error correction step, is large enough to achieve convergence.

The fine tuning capacitor(s) advantageously serve(s) to add values smaller than an LSB, i.e. correction steps corresponding to voltage steps of ½, ¼ and or ⅛ or less LSB. This provides a digital correction in steps of entire LSBs. After having switched all capacitors which need digital trimming due to mismatch (i.e. for example the capacitors oft the MAINDAC), a corresponding digital correction value is added to the intermediate digital conversion result. This value is based on the digital error correction values for each capacitor which needs trimming. The digital error correction values are initially determined during a calibration process. A digital correction value may have a precision of more than an LSB, i.e. for example of ½, ¼ or less LSB. This fraction of an LSB may then be corrected in an analog manner, i.e. through the switching of a fine tuning capacitor.

In an embodiment, the arithmetic stage may be adapted to sum multiple individual digital correction values in accordance with the setting of the capacitors of the array. This provides additional flexibility and reduces complexity of the circuit.

In an embodiment, the arithmetic stage may include a shifting stage (e.g., registers or multiplexers) for shifting digital values. In one aspect, the shifting stage may be adapted to vary resolution and range of the stored trim values. According to this aspect, it may be provided that the trimming range is variable and can be chosen between a large trimming range with raw resolution (e.g., full LSB) and a limited trimming range with higher resolution (e.g. ½ LSB, or ¼ LSB or less).

In an embodiment, the arithmetic stage may include a scaling stage for scaling the digital correction value of the least significant trimmed capacitor so as to serve as an additional correction value for higher significant capacitors that have to be trimmed. A fraction of the necessary digital trimming for the more significant trimmed capacitors (more significant than the least significant trimmed capacitor) may be derived from the digital correction value of the least significant trimmed capacitor. The way of deriving the values may consist in shifting the digital values (shifting the bit positions), which may correspond to a multiplication or division by two for each shifted bit position. This provides smaller digital word size for the trimming words of the more and most significant bits and can be used for trimming the combined ratio of the capacitance value of the least significant trimmed capacitor and all other trimmed capacitors with higher significance with respect to the remaining capacitors of the capacitive array. For example, the whole MAINDAC can then efficiently be trimmed with respect to the SUBDAC and the scaling capacitor used to couple MAINDAC and SUBDAC. In prior art ADCs this trimming procedure was performed with laser trimming of the scaling capacitor between the MAINDAC and SUBDAC. According to this aspect of the invention, the whole MAINDAC is digitally trimmed instead of the scaling capacitors. This avoids switches to be coupled to high impedance nodes (common node) of the CDAC.

Furthermore, the arithmetic stage may be adapted to perform gain and/or offset correction through digital correction values. This may advantageously be combined with the above explained embodiments using fine tuning capacitors, i.e., partial analog correction of fractions of LSBs. A multiplier may be provided for multiplying the corrected digital conversion result (intermediate or final) with a gain correction value for compensating a gain error. The multiplier may advantageously be adapted to perform multiplication (i.e., to calculate) with a resolution that is higher than the significance of the smallest fine tuning capacitor. The multiplier may be implemented so as to perform the multiplication as a series of consecutive adding steps during analog-to-digital conversion.

The invention also relates to a method of analog-to-digital conversion using successive approximation. Digital error correction values for compensating a static mismatch of capacitance values of a plurality of capacitors are determined. Successive approximation steps are performed and an intermediate conversion result is corrected (adjusted) with the error correction values. An error correction step is performed after an approximation step. The maximum error voltage due to static mismatch of previously used capacitors is (equal to or) lower than a maximum voltage change which can be achieved during subsequent steps on the common node. The subsequent steps may include normal approximation steps and further error correction steps.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
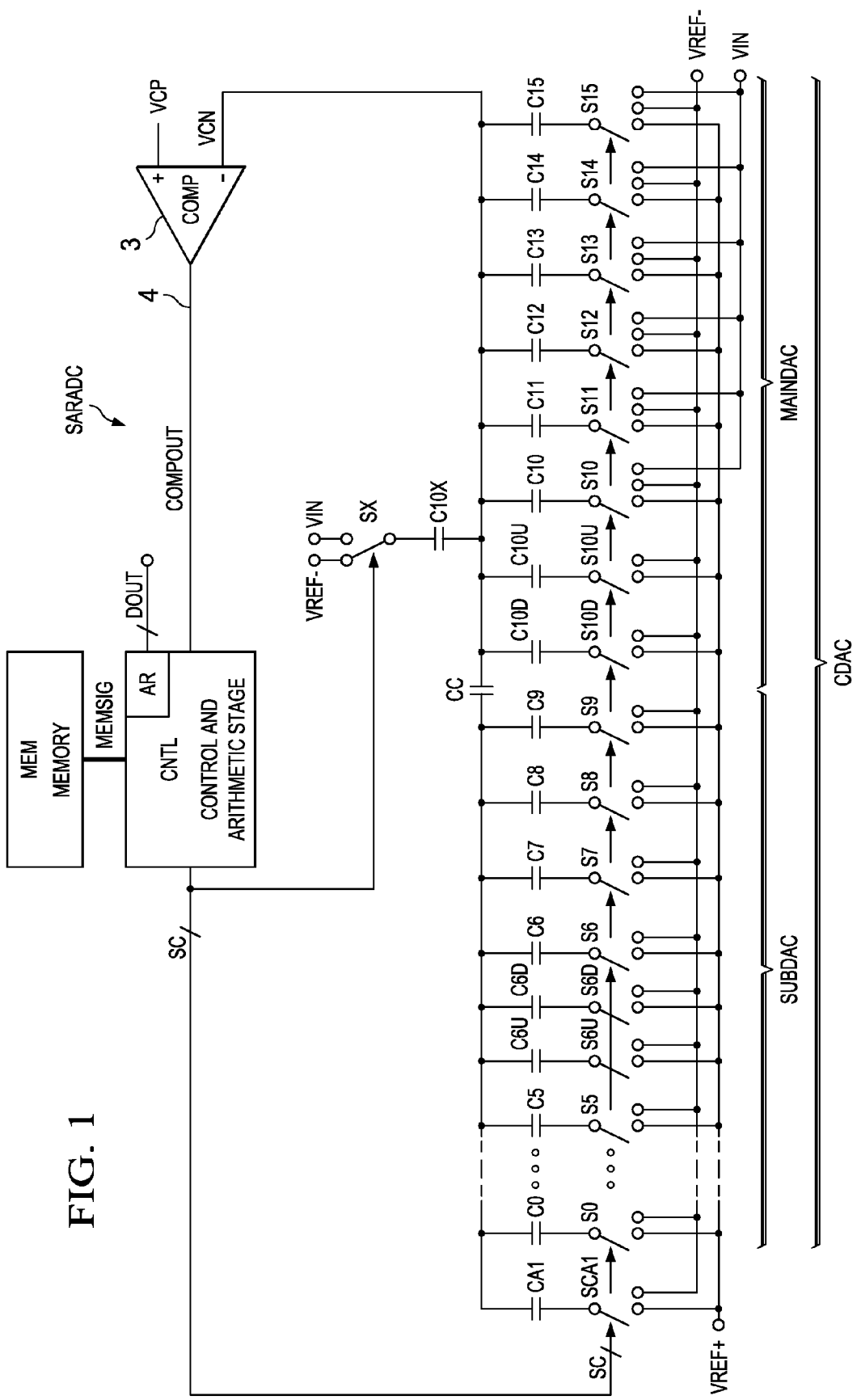
FIG. 1 shows a simplified circuit diagram of a preferred embodiment of the invention.

Turning to FIG. 1 of the drawings, the reference numeral 100 generally designates a SAR ADC in accordance with preferred embodiment of the present invention. ADC 100 generally comprises a CDAC 112, controller 1056, memory 102, and comparator 110. CDAC is further subdivided into two stages (a main CDAC 114 and sub-CDAC 112) with capacitor CC (which serves as a scale-down capacitor) coupled therebetween. Sub-CDAC 116 generally comprises capacitors C0 to C9 and switches S0 to S9, while main CDAC includes capacitors C10U, C10D, and C10 to C15, and switches S10U, S10D, and S10 to S15. Capacitor CC and the sub-CDAC 114 may have the same capacitance value as capacitor C10. Additionally, capacitors C15 to C10 are associated with more significant bits than the capacitors C9 to C0. For example, capacitor C15 has the greatest capacitance value and is the most significant capacitor, while capacitor C0 has the smallest capacitance value and is the least significant capacitor. Switches S0 to S15 are provided in order to connect one side of the capacitors of the CDAC 112 to either a first reference voltage REFP, a second reference voltage REFM, or to an input voltage VIN (as appropriate). The switches S0 to S15 are controlled through control signals from controller 106 according to successive approximation. The controller 106 includes also an arithmetic unit 108. The comparator 110 has a negative input node VCN, which serves as the common node. The positive input of the comparator 110 is the node VCP. The output of comparator 110 is coupled to the controller 106. The controller 106 includes the successive approximation register.

In conventional configurations, capacitors C15 to C10 would be trimmed by a complex trimming network or would be trimmed in a post production laser trimming step. Here, however, ADC 100 does not need fine tuning capacitors or switches for capacitors C15 to C10. Any static or dynamic error, which may be due to mismatch of the capacitance values of the capacitors C15 to C10 is compensated for in a error correction step, which is performed with capacitors C10D and C10U. After C10 is switched to either REFP or REFM in accordance with an approximation step, these two capacitors are switched to either the first reference voltage REFP or the second reference voltage REFM in order to establish convergence of the entire conversion procedure.

The conversion procedure starts with most significant capacitor C15 in order to determine the MSB and switch S15 is set accordingly. The procedure continues in order of significance (i.e., in order of the charge/voltage contribution to the common node VCN) of the remaining capacitors (i.e., with capacitors C14, C13, C12, C11 and C10). The respective bits (i.e., the MSBs of the digital output word) are set accordingly. At the beginning of a conversion cycle, capacitor C10U and C10D are coupled to reference voltages REFM and REFP, respectively. During conversion step, the capacitor C10 is first switched to reference voltage REFP. If voltage at node VCN is less than the voltage at node VCP, the comparator 110 outputs low signal, while switch S10 coupled capacitor C10 to reference voltage REFP. If voltage at node VCN is greater than the voltage at node VCP, the comparator 110 outputs a high signal, while switch S10 coupled capacitor C10 to reference voltage REFM.

After the conversion step corresponding to capacitor C10, the error correction step using capacitor C10D and C10U is performed. If the comparator 110 is low at the beginning of the error correction step, capacitor C10U is switched from reference voltage REFM to reference voltage REFP. When the comparator 110 output remains low, capacitor C10U will be kept at reference voltage REFP. If the comparator 110 output changes to high, no correction is required, and capacitor C10U will be switched back to reference voltage REFM. If the comparator 110 output is high after conversion for capacitor C10, nothing changes at the beginning of the error correction step. If the comparator 110 remains high, C10D is switched from reference voltage REFP to reference voltage REFM. If the comparator 110 output changes to a low signal, no correction is required. After this correction step, the remaining steps for capacitors C9 to C0 are performed.

The capacitance values of the capacitors C0 to C15 generally meet a specific condition. For the case, that the last error correction capacitor is after C10, The sum of the capacitance values of capacitors C0 to C9 must be equal or larger than the capacitance value of capacitor C10 minus the capacitance value of capacitor C0, for example, $$C0+C1+C2+C3+C4+C5+C6+C7+C8+C9 \geq C10-C0 \quad (5)$$

with C0 to C10 being the capacitance values of the respective capacitors.

The error correction step with capacitor C10 provides that the remaining successive approximation process converges, but only if the condition is met. If more than one error correction step is performed, convergence is generally ensured at least insofar as the combination of all correction steps establishes convergence. According to the condition, it is generally required that even under worst case condition (i.e., maximum production spread or maximum mismatch) the sum of the capacitance values of all capacitors being associated with bits of a significance below the error correction position must be smaller than the capacitance value of the capacitor to which the error correction is applied minus the capacitance value of the capacitor associated with the least significant bit position. This condition can be set up for any capacitive array. In order to determine at which position the error correction step should at least be performed (i.e., which capacitor should have the associated correction capacitors), the production spread or maximum expected mismatch of the capacitance values of the technology used for manufacturing the IC should be known. If the condition is not met, there will be a gap in the transfer function of the ADC 100 that cannot generally be closed by digital error correction only.

However, if convergence of the successive approximation process is established under all mismatch conditions, the mismatch of the capacitors can be determined in an initial calibration step and the mismatch can then be digitally compensated during the analog-to-digital conversion steps. The digital correction values which are used for compensating the static mismatch of the capacitors can be stored in a memory 102, which may be a random access memory (RAM) or read-only memory (ROM), for example an electronically erasable programmable ROM (EEPROM). During analog-to-digital conversion, the controller 106 may then retrieve the correction values from the memory 102 through bus 104 (including all necessary data and control signals) and add or subtract them from the conversion result, which is based on capacitors which do not match. Therefore, the digital correction values are different from correction values which may be used for dynamic error correction according to the prior art, as the correction values according to this aspect of the invention, include the mismatching capacitance values. The digital correction values represent a compensation of a static error instead or in addition to a dynamic error. Practically, the error correction values will then have more relevant bits then for the conventional dynamic error correction, where only a single bit at the error correction position is relevant. The bits of the digital correction values are particularly relevant in the most significant positions, i.e. for those capacitors (e.g., capacitors C15 to C10), which are conventionally physically trimmed. However, since physical trimming is not applied any more, the mismatch compensation is performed through digital correction by adding or subtracting digital correction values. The changes to the conventional analog-to-digital converters are only minor since an adder and a memory may already be present for conventional dynamic error correction.

A second error correction step may be performed with correction capacitors C6U, C6D similar to the error correction step with C10U, C10D. The second error correction step may be performed after the approximation step relating to C6 and it may have its own contribution to convergence.

There is also an additional capacitor C10X and a switch SX for compensating gain mismatch if the input signal is only sampled on the main CDAC 114. This gain error may be 64/63. In order to compensate for the gain error, capacitor C10X with the same capacitance value as capacitor C10 is used for sampling the input voltage VIN. After having sampled the input voltage VIN, this capacitor C10X may be switched to negative reference voltage REFM (which may be ground). It can then be disregarded during the remaining conversion steps.

A fine tuning capacitor CA1 may also be provided. Capacitor CA1 is (optionally) coupled to sub-CDAC 112. The contribution in voltage change on the common node VCN of the fine tuning capacitor CA1 may only be a fraction of the contribution of the capacitor corresponding to an LSB. The capacitance value of capacitor CA1 may then only be a fraction of the capacitance value of the smallest capacitor C0 of the CDAC 112. Capacitor CA1 is used as a fine tuning capacitor in order to provide additional accuracy of the ADC 100. The error correction values for compensating mismatch of capacitors C15 to C10 may then advantageously be extended by at least one bit (LSB) in order to represent a fraction of an LSB, which corresponds to capacitor C0. The digital correction values can be determined during an initial calibration procedure performed before normal conversion. The calibration can be performed with very precision. The error correction values may then have higher resolution (larger bit width) than the digital output word of the converter. The mismatch of capacitors C9 to C0 may not be compensated by digital error correction values since mismatch of these less significant capacitors can be insignificant. After the last step with a trimmed capacitor, the LSBs or the LSB of the ex-tended error correction values are evaluated and switch SCA1 is set in accordance with the new, such as an additional LSB (e.g., corresponding to ½, ¼ or ⅛ LSB or less) of the digital error correction values (i.e., rather a sum of all digital error correction values of the preceding capacitors with higher significance). This provides additional precision of the ADC 100 of 17 bit in the present example. In addition to the single fine tuning capacitor CA1, more fine tuning capacitors may also be provided, which will then entail further extension of the digital correction values. This can provide a further increase of the internal precision of the ADC 100. The digital output words DOUT may not be extended. Accordingly, there may be additional fine tuning capacitors of ½ LSB, ¼ LSB and/or ⅛ LSB. This aspect also provides that fractions of LSBs are only compensated in an analog manner. The digital correction of mismatch (e.g. adding correction values to intermediate conversion results or final conversion results of the ADC) may then be limited to full LSBs of the ADC 100.

Figure 2:
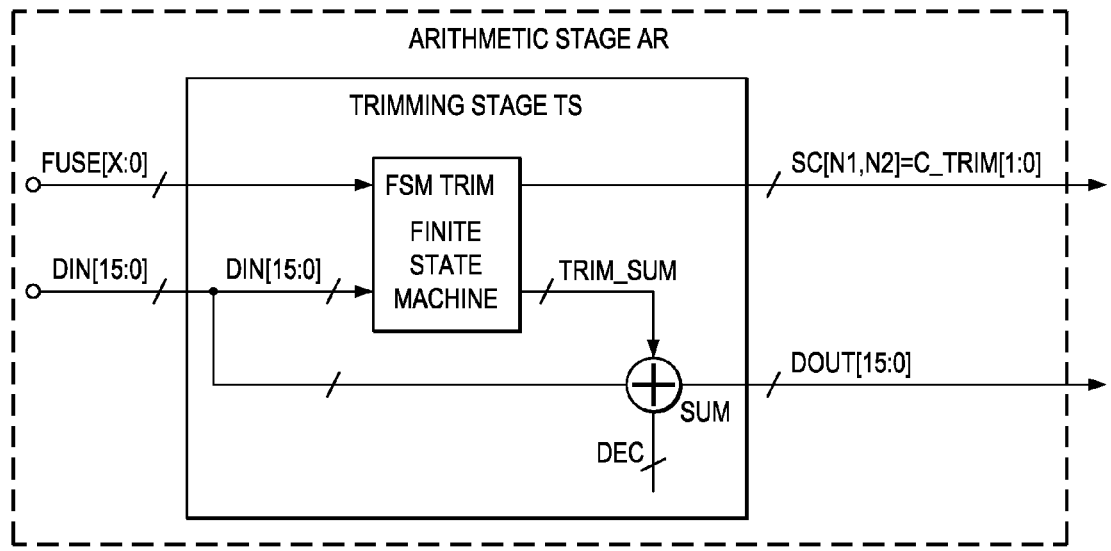
FIG. 2 shows a simplified block diagram of a part of a control and arithmetic stage of FIG. 1.

Turning now to FIG. 2, shows a simplified block diagram of a unit 108 of the controller 106 shown in FIG. 1. The trimming circuit 202 receives digital trimming values FUSE [45:1]. It also receives the intermediate digital conversion result (or final result) DIN[15:0]. The more significant bits DIN[15:10] are passed to a finite state machine 204 and the remaining less significant bits DIN[9:0] are passed to a adder 206. The more or most significant bits DIN[15:10] relate to the capacitors C15 to C10. Here, these are the capacitors C15 to C10 are trimmed due to their mismatch. The finite state machine 204 calculates a trimming sum SUM and two additional trimming values (signal TRIM[1:0]) which are coupled to switch fine tuning capacitors, as, for example CA1 shown in FIG. 1. Since signal TRIM[1:0] has a bit width of two, two capacitors can be switched. Therefore, an analog correction of ½ LSB and ¼ LSB may be performed. Signal DOUT[15: 0] is the digitally adjusted or trimmed conversion result. It includes the sum of the trimming values, which are provided from the memory through signals FUSE[X:0], the digital intermediate or final conversion result and the digital error correction values DEC for the error correction steps. The bus width of FUSE[X:0] relates to all required correction values and control signals for trimming the mismatch of the capacitors C0 through C15 of the CDAC 112.

Figure 3:
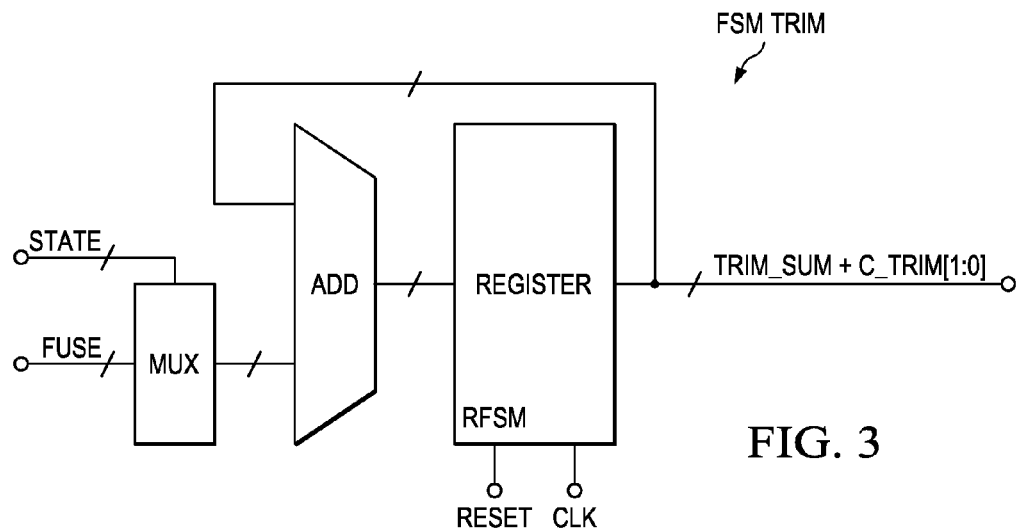
FIG. 3 shows an embodiment of a finite state machine to be used in the trimming stage of FIG. 2.

Tuning now to FIG. 3, a simplified block diagram of the finite state machine 204 of FIG. 2 can be seen. For each state or step of the conversion procedure of the ADC 100, a specific value of bit values received from the memory (from signal FUSE[X:0]) is passed to an adder 304. The sum provided by the adder 304 is passed to a register 306, the output of which is fed back to the adder 304. Accordingly, dependent on the conversion step, all digital correction values received through the multiplexer 302 and belonging to a specific capacitor (e.g., capacitors C15 to C10, C10U, and C10D) of the CDAC 112 are added up, in order to provide the complete digital correction value SUM including optional bit values TRIM[1: 0] for switching the fine tuning capacitors (i.e., capacitor CA1). The register 306 is reset (by asserting the RESET signal) after each complete trimming cycle and clocked with the system clock CLK. For example, a clock of 8 MHz may be used.

Figure 4:
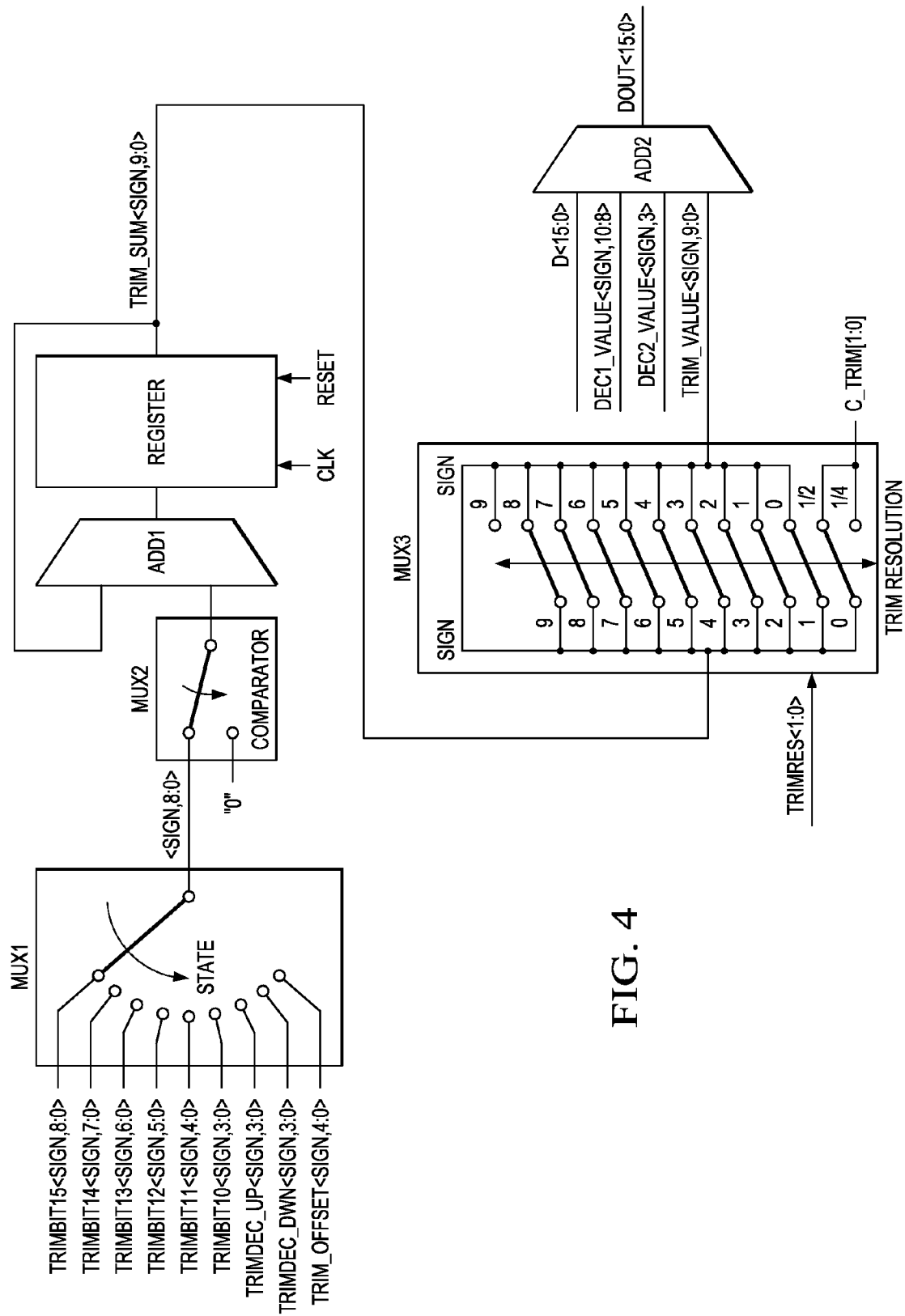
FIG. 4 shows a simplified block diagram of the arithmetic stage of FIG. 1.

FIG. 4 shows an embodiment of an arithmetic unit 108 in more detail. The mismatch of the capacitors of the ADC 100 is measured during an initial calibration process. The values may be stored in the memory 102 shown in FIG. 1. The digital correction values are passed to multiplexer 402 as digital values TRIMBIT15<SIGN, 8:0>, TRIMBIT14<SIGN, 7:0>, TRIMBIT13<SIGN, 6:0>, TRIMBIT12<SIGN, 5:0>, TRIMBIT11<SIGN, 4:0>, TRIMBIT10<SIGN, 3:0>, TRIMDEC_UP<SIGN, 3:0>, and TRIMDEC_DWN<SIGN, 3:0>. Furthermore, this includes an additional digital correction value TRIM_OFFSET<SIGN, 4:0> for adjusting an offset of the ADC 100. In accordance with their significance (capacitance value or voltage step contribution) each correction value has a specific bit length. A smaller significance of the capacitor entails a smaller bit width of the correction word. Furthermore, in accordance with the direction of the deviation of the capacitance value due to mismatch, a positive or negative sign of the correction value is provided. The digital correction values are passed to multiplexer 402. In accordance with the conversion step (signal STATE), one, two, or more of the digital values are consecutively passed to the multiplexer 404. The multiplexer 404 is switched between the respective selected digital correction value received from multiplexer 402 and a value '0' in accordance with the comparator 110 output. This corresponds to the setting of the respective capacitors, since a correction of the capacitance value is generally necessary if the comparator 110 output is high (the corresponding capacitor is switched to a positive reference voltage REFP). The output of multiplexer 404 is passed to adder 304 which is coupled to a register 306 for storing the sum of digital correction values in accordance with the used capacitors and the step of the conversion. The summing is performed in several cycles using a clock signal CLK and feeding back the intermediate result contained in the register 306. The complete sum SUM is then passed to multiplexer 406, which is adapted to adjust the trimming resolution. Multiplexer 406 serves as a shifting stage adapted to vary resolution and range of the stored trimming values, and multiplexer 406 may shift the digital correction value SUM in response to control signal TRIMRES<1:0> so as change the resolution of the trimming values. The control signals TRIMRES<1:0> may be retrieved from a memory or register. The value of resolution control signal TRIMRES<0: 1> relates to the resolution of the stored digital correction values. This aspect relates to whether or not the resolution of the correction value is more precise than an LSB of the ADC 100. Accordingly, the correction values for the fine tuning capacitors (the fine tuning signals are indicated here as ½ LSB and ¼ LSB) may be included or excluded by shifting the correction values up or down. This has an effect on the precision and the range of the digital calibration procedure. If the digital correction values of the capacitors are less precise than ½ LSB, it may not be necessary to use fine tuning capacitors. According to this aspect, it may be provided that the trimming range is variable and can be chosen between a large trimming range with raw resolution (e.g., full LSB) and a limited trimming range with higher resolution (e.g., ½ LSB, or ¼ LSB or less).

Multiplexer 406 is coupled to adder 408 for passing adjusted trimming value TRIM_SUM<SIGN, 9:0> as signal TRIM_VALUE<SIGN, 9:0> to the adder 408. This adder stage ADD2 further receives correction values relating to the error correction steps: a first error correction step having a value DEC1_VALUE<SIGN, 10:8> and a second correction step having a value DEC2_VALUE<SIGN,3>. Adder 408 is also adapted to add all correction values to the intermediate or final conversion result DIN<15:0>. Eventually, adder 408 provides the digitally corrected conversion result DOUT<15: 0>.

Figure 5:
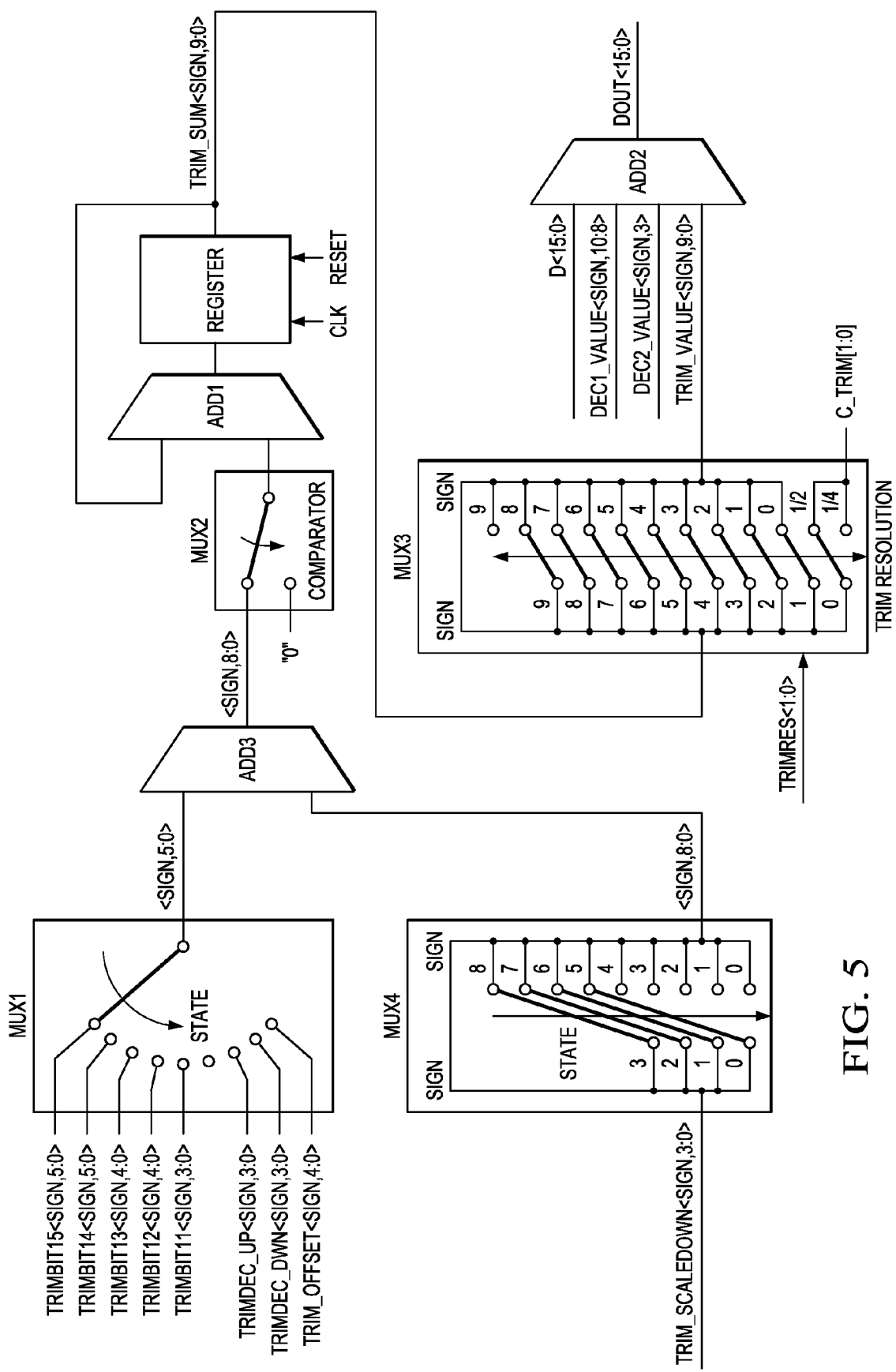
FIG. 5 shows a simplified circuit diagram of the arithmetic stage of FIG. 1.

FIG. 5 shows a simplified block diagram of another example of the arithmetic unit 108. Most of the stages shown in FIG. 5 are similar to those of the embodiment shown in FIG. 4 and have the same functionality. In addition to the stages shown in FIG. 4, multiplexer 502 and adder 504 are included. Multiplexer 502 may then serve as a scaling stage for the digital correction value of the least significant trimmed capacitor. This least significant trimmed capacitor may be capacitor C10. As mentioned before, it is assumed that only the capacitors of the main CDAC 114 need trimming. However, the capacitors C0 to C15 as a whole may then still have a mismatch. A conventional approach may use laser trimming of the scaling capacitor CC in order to adjust the ratio. Here, a different approach is used. Capacitors C10 to C15 are digitally corrected. The scaling is based on the mismatch of the last trimmed capacitor with respect to the combined capacitance vale of the remaining (not trimmed) less significant capacitors. The last trimmed capacitor C10 may have a capacitance value that is equal to the combined capacitance value of all less significant capacitors (i.e., capacitors C9, C8, and so forth). Once the required correction value for this specific mismatch is established (e.g., in an initial calibration procedure) the same but shifted value must be used for all other more significant trimmed capacitors (capacitors C11 through C15). The scaling signal TRIM_SCALEDOWN<SIGN, 3:0> is in then the digital correction value of the least significant trimmed capacitor C10 (i.e., it may correspond to TRIMBIT10 of FIG. 4). In this embodiment it has a bit width of 4 bit. According to the conversion state (State), scaling signal TRIM_SCALEDOWN<SIGN, 3:0> is coupled to more or less significant bit positions of output signal SCALE_OUT<SIGN, 8:0>. Signal SCALE_OUT<SIGN, 8:0> is added to the least significant bits MUX1_OUT<SIGN, 5:0> of the selected digital correction value. Adder 504 adds the two values and passes the sum to multiplexer 402. Since signal TRIM_SCALEDOWN is the digital correction value for C10, TRIMBIT10 can be omitted on multiplexer 402. Furthermore, the bit width of all other digital correction values TRIMBIT11 to TRIMBIT15 can be reduced by the number of bits of TRIM_SCALEDOWN or TRIMBIT10. The digital correction values are then passed to multiplexer 402 as digital values TRIMBIT15<SIGN, 5:0>, TRIMBIT14<SIGN, 5:0>, TRIMBIT13<SIGN, 5:0>, TRIMBIT12<SIGN, 4:0>, TRIMBIT11<SIGN, 4:0>, TRIMDEC_UP<SIGN, 3:0>, and TRIMDEC_DWN<SIGN, 3:0> and the offset trimming value TRIM_OFFSET<SIGN, 4:0>. Accordingly, some of the additional memory space required for the digital correction of capacitors C10 to C15 can be regained. In other words, the scaling stage (multiplexer 502 and adder 504) for scaling the digital correction value TRIM_SCALEDOWN of the least significant trimmed capacitor allows the digital correction value TRIM_SCALE-DOWN to be used for higher significant trimmed capacitors. This provides smaller digital word size for the trimming words of the more and most significant bits. This can be used to trim the combined ratio of the capacitance value of the least significant trimmed capacitor and all other trimmed capacitors with higher significance with respect to the remaining capacitors of the capacitive array. For example, the main CDAC 114 can then efficiently be trimmed with respect to the sub-CDAC 116 even including the scaling capacitor used to couple main CDAC 114 and sub-CDAC 116, if a scaling capacitor is used.

Figure 6:
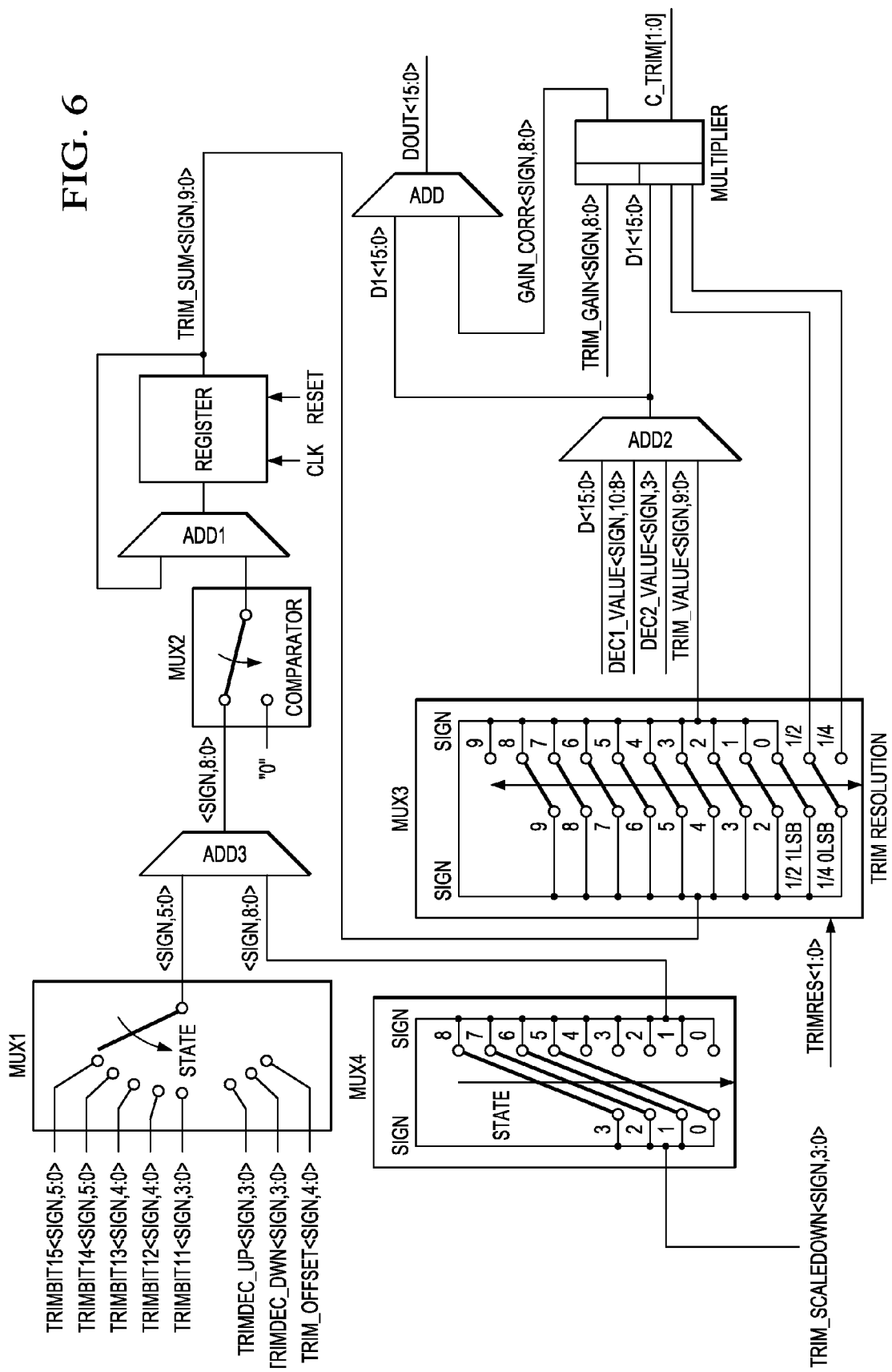
FIG. 6 shows a simplified circuit diagram of the arithmetic stage of FIG. 1.

FIG. 6 is similar to the embodiment of FIG. 5. In addition to the stages in FIG. 5, FIG. 6 also includes a multiplier 602 for performing a gain correction step. Correcting the gain of the digital conversion result means that a multiplication is performed. The output signal of adder 408 is now digital output value D1<15:0>. This output value D1<15:0> is multiplied with a gain trimming value TRIM_GAIN<SIGN, 8:0>. The result is a corrected digital output value GAIN-_CORR which has to be added to the trimmed output value D1<15:0>. This is performed with adder 604. The result is provided at the output of adder 604 as digital output signal DOUT<15:0>. Multiplier 602 also includes the bits for the fine tuning capacitors in the calculation and provides corrected values for the fine tuning capacitors as ½ LSB and ¼ LSB (TRIM[1:0]). In order to avoid sudden changes in the output values (e.g., of an entire LSB), the multiplication may internally be performed with a higher precision including ½, ¼ and ⅛ LSB values. The fraction of an LSB is then corrected in an analog manner, while the integer part is digitally corrected. The multiplier may then be adapted to have enough fractional bit positions so as to limit an error of the correction values to a value smaller than ½ of the smallest fraction of an LSB (e.g. 0.5*⅛ LSB). A good point of time for providing the result of the multiplication and setting of the analog correction capacitors may be before the last error correction step. This can be necessary in order to avoid any influence of the fine tuning capacitors (e.g. ½, ¼ and ⅛ LSB) on the convergence of the ADC 100. Therefore, the product of the correction value and the LSBs may advantageously be smaller than ¹⁄₁₆ LSB here.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a capacitive digital-to-analog converter (CDAC) that includes:
      a plurality of capacitors that are each coupled to a common node; and
      a plurality of switches, wherein each switch is coupled to at least one of the capacitors;
   a comparator having a first input terminal, a second input terminal, and an output terminal, wherein the first input terminal of the comparator is coupled to the common node; and
   a controller that is coupled to the comparator and each of the switches, wherein the controller is configured to control the voltage level on the common node during a plurality of successive approximation steps by consecutively switching the capacitors to at least one of a first reference voltage and a second reference voltage in response to the bit decisions of the comparator, and wherein the controller performs at least one error correction step after an approximation step so as to limit an error voltage on the common node to an amount that is equal to or lower than a maximum voltage change on the common node that can be achieved during subsequent steps.

2. The apparatus of claim 1, wherein the CDAC further comprises:
   a first CDAC;
   a second CDAC; and
   a coupling capacitor that is coupled between the first CDAC and the second CDAC.

3. The apparatus of claim 2, wherein the first CDAC further comprises:
   a first set of capacitors from the plurality of capacitors;
   a first set of switches from the plurality of switches, wherein each switch from the first set of switches is coupled to at least one of the capacitors from the first set of capacitors, and wherein each switch is adapted to provide an input voltage, the first reference voltage, and the second reference voltage to its corresponding capacitor;
   a first error correction capacitor;
   a first error correction switch that is coupled to the first error correction capacitor, wherein the first error correction capacitor is adapted to the first reference voltage and the second reference voltage to the first error correction capacitor;
   a second error correction capacitor; and
   a second error correction switch that is coupled to the second error correction capacitor, wherein the second error correction capacitor is adapted to the first reference voltage and the second reference voltage to the second error correction capacitor.

4. The apparatus of claim 3, wherein the second CDAC further comprises:
   a second set of capacitors from the plurality of capacitors;
   a second set of switches from the plurality of switches, wherein each switch from the second set of switches is coupled to at least one of the capacitors from the second set of capacitors, and wherein each switch is adapted to provide the first reference voltage and the second reference voltage to its corresponding capacitor;

a third error correction capacitor;
a third error correction switch that is coupled to the third error correction capacitor, wherein the third error correction capacitor is adapted to the third reference voltage and the second reference voltage to the third error correction capacitor;
a fourth error correction capacitor; and
a fourth error correction switch that is coupled to the fourth error correction capacitor, wherein the fourth error correction capacitor is adapted to the first reference voltage and the second reference voltage to the fourth error correction capacitor.

5. An apparatus comprising:
  a capacitive digital-to-analog converter (CDAC) that includes:
    a plurality of capacitors that are each coupled to a common node; and
    a plurality of switches, wherein each switch is coupled to at least one of the capacitors;
  a comparator having a first input terminal, a second input terminal, and an output terminal, wherein the first input terminal of the comparator is coupled to the common node; and
  a controller that is coupled to the comparator and each of the switches, wherein the controller is configured to control the voltage level on the common node by controlling each of the switches in response to the bit decisions of the comparator, wherein the controller includes an arithmetic unit that generates a digital output signal and a trim signal.

6. The apparatus of claim 5, wherein the CDAC further comprises:
  a first CDAC;
  a second CDAC; and
  a coupling capacitor that is coupled between the first CDAC and the second CDAC.

7. The apparatus of claim 6, wherein the first CDAC further comprises:
  a first set of capacitors from the plurality of capacitors;
  a first set of switches from the plurality of switches, wherein each switch from the first set of switches is coupled to at least one of the capacitors from the first set of capacitors, and wherein each switch is adapted to provide an input voltage, the first reference voltage, and the second reference voltage to its corresponding capacitor;
  a first error correction capacitor;
  a first error correction switch that is coupled to the first error correction capacitor, wherein the first error correction capacitor is adapted to the first reference voltage and the second reference voltage to the first error correction capacitor;
  a second error correction capacitor; and
  a second error correction switch that is coupled to the second error correction capacitor, wherein the second error correction capacitor is adapted to the first reference voltage and the second reference voltage to the second error correction capacitor.

8. The apparatus of claim 7, wherein the second CDAC further comprises:
  a second set of capacitors from the plurality of capacitors;
  a second set of switches from the plurality of switches, wherein each switch from the second set of switches is coupled to at least one of the capacitors from the second set of capacitors, and wherein each switch is adapted to provide the first reference voltage and the second reference voltage to its corresponding capacitor;
  a third error correction capacitor;
  a third error correction switch that is coupled to the third error correction capacitor, wherein the third error correction capacitor is adapted to the third reference voltage and the second reference voltage to the third error correction capacitor;
  a fourth error correction capacitor; and
  a fourth error correction switch that is coupled to the fourth error correction capacitor, wherein the fourth error correction capacitor is adapted to the first reference voltage and the second reference voltage to the fourth error correction capacitor.

9. The apparatus of claim 8, wherein the arithmetic unit further comprises:
  a finite state machine that generates a sum signal and the trim signal; and
  an adder that is coupled to the finite state machine and that generates the digital output signal.

10. The apparatus of claim 9, wherein the adder further comprises a first adder, and wherein the finite state machine further comprises:
  multiplexer;
  a second adder that is coupled to the multiplexer; and
  a register that is coupled to the first and second adders.

11. The apparatus of claim 10, wherein the multiplexer further comprises a first multiplexer, and wherein the finite state machine further comprises:
  a second multiplexer that is coupled between the first multiplexer and the first adder; and
  a third multiplexer that is coupled between register and the first adder.

12. The apparatus of claim 11, wherein the finite state machine further comprises:
  a fourth multiplexer; and
  a third adder that is coupled between the first and second multiplexers and that is coupled to the fourth multiplexer.

13. The apparatus of claim 12, wherein the finite state machine further comprises:
  a fourth adder that is coupled to the third multiplexer; and
  a multiplier that is coupled between the fourth adder and the first adder.

* * * * *